United States Patent [19]

Schwartz

[11] 4,048,560
[45] Sept. 13, 1977

[54] ELECTRICAL METER APPARATUS

[75] Inventor: Edwin L. Schwartz, Los Angeles, Calif.

[73] Assignee: Rite Autotronics Corporation, Los Angeles, Calif.

[21] Appl. No.: 741,543

[22] Filed: Nov. 15, 1976

[51] Int. Cl.² ............... G01R 15/08; H01H 19/58
[52] U.S. Cl. .................................. 324/115; 200/11 G
[58] Field of Search ............................ 324/115, 156; 200/11 DA, 11 G

[56] References Cited

U.S. PATENT DOCUMENTS

| 2,792,549 | 5/1957 | Bernreuter | 324/115 |
| 2,896,033 | 7/1959 | Hartz | 200/11 DA |
| 3,594,527 | 7/1971 | Brant et al. | 200/11 G |

*Primary Examiner*—Rudolph V. Rolinec
*Assistant Examiner*—Ernest F. Karlsen
*Attorney, Agent, or Firm*—Robert E. Geauque

[57] ABSTRACT

An electrical meter apparatus wherein the elements of construction of the meter are so constructed as to not warrant any significant amount of precision in manufacture. A selector knob is connected to a switch rotor with a switch rotor being mounted upon a panel bushing which is fixedly connected to the meter housing. A limited amount of canting movement is permitted along with the normal rotative movement between the switch rotor and the panel bushing. The switch rotor is connected in a non-precision manner with a socket and a plug. The plug is loose fittingly connected within an opening in the printed circuit board of the meter. A limited amount of canting movement of the plug is capable of occurring with respect to the printed circuit board. A single electrical contact member is fixed to the panel bushing and includes on opposite sides thereof resilient electrical contact elements which are to physically contact the printed circuit board and tend to maintain the plug in axially alignment within the opening.

3 Claims, 4 Drawing Figures

ELECTRICAL METER APPARATUS

BACKGROUND OF THE INVENTION

This invention is an improvement of the invention described and claimed within U.S. Pat. No. 3,924,185, issued Dec. 2, 1975, by the same Assignee.

In the construction of electrical meters, a serious drawback to minimizing the cost of construction has been the precision which is required between the interrelated parts of the meter. The elements which connect with the manually rotatable knob of a meter, and the elements which interconnect the knob with the printed circuit board within the meter, have been previously been thought to be required to be manufactured quite accurately in order for the different parts of the meter to connect together when assembled and also, to minimize the wear between the elements of the meters so as to permit the meter to have a satisfactory useful life. Precision parts are a costly factor in any meter construction. Yet, if precision between the interrelated parts of an electrical meter could be eliminated without foregoing accuracy of the meter of lowering the useful life of the meter, the manufacturing costs of such a meter could be substantially lowered which would make such meters more readily available to a greater proportion of the purchasing public.

Within the aforementioned patent, there were two separate electrical contacts connected together in assembly about the panel bushing. Basically, these separate contacts have been combined into a single unit within this invention.

SUMMARY OF THE INVENTION

The meter construction of this invention is to employ a conventional meter D'Arsonval movement mounted within the housing of the meter. A manual selector knob is attached to the housing and is to effect rotation of the rotor switch. The rotor switch is movable to various fixed positions and tends to remain in a said position until it is manually moved out of that position. The rotor switch is connected to the housing by means of a panel bushing. The panel housing permits free rotative movement of the rotor switch in respect thereto and also permits a limited amount of canting movement of the rotor switch in respect to the housing. The central shaft of the rotor switch being connecting in a loose fitting manner to a socket within a plug. The plug being mounted in a loose fitting manner within an opening in the printed circuit board. A single electrical contact member having a pair of electrical contacts is fixedly mounted on the plug. Each of the contacts are to physically contact appropriate printed circuits formed upon the printed circuit board. The contacts are formed like a spring which cooperate to exert a bias upon the plug tending to maintain such in axially alignment within the opening in the printed circuit board. However, a limited amount of canting movement on the plug with respect to the printed circuit board can occur without effecting the electrical interconnection between the contacts and the printed circuit board.

DETAILED DESCRIPTION OF THE SHOWN EMBODIMENT

Figure 1:
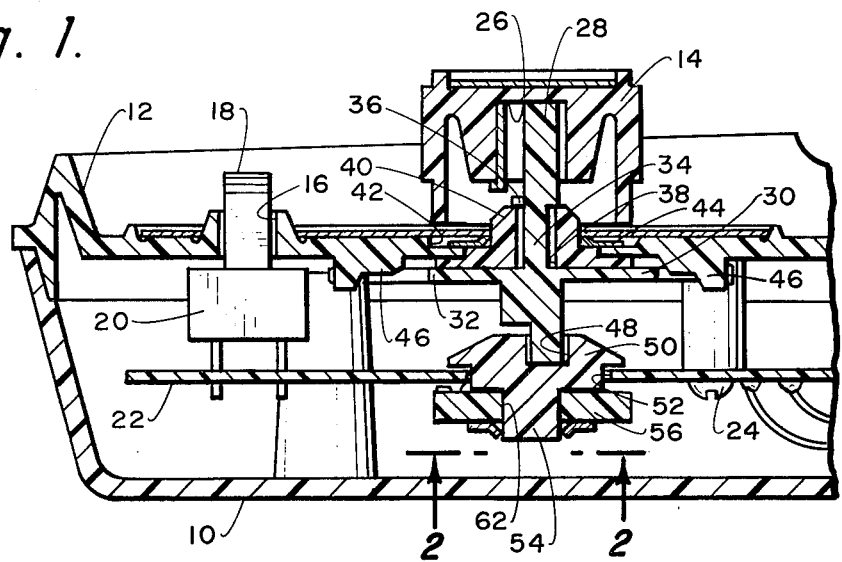
FIG. 1 is a cross-sectional view through a portion of the meter apparatus of this invention.
Figure 2:
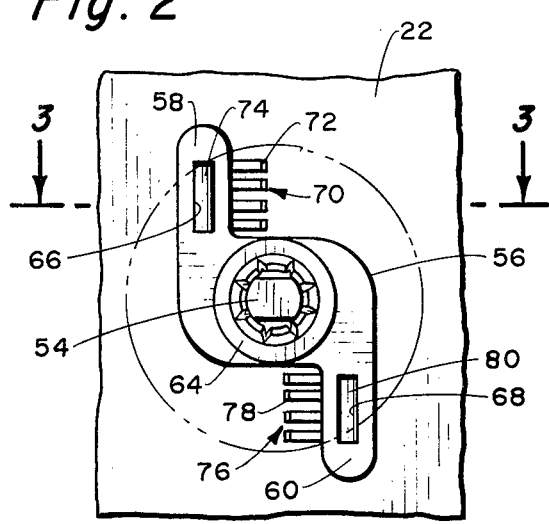
FIG. 2 is a view taken along line 2—2 of FIG. 1.
Figure 4:
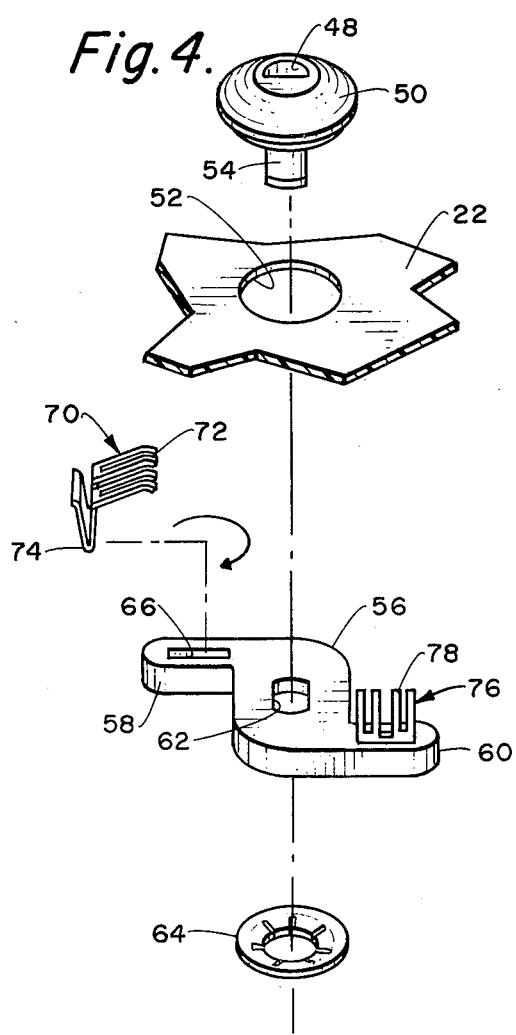
FIG. 4 is an exploded isometric view of the novel selector means of this invention.
Figure 3:
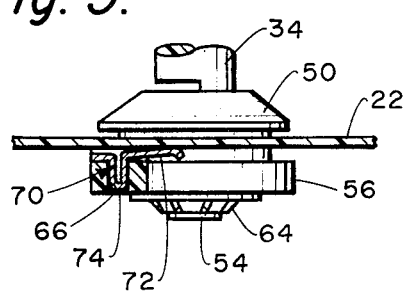
FIG. 3 is a cross-sectional view taken along line 3—3 of FIG. 2.

Within this specification, background as to basic meter construction has been omitted and reference is to be had to the aforesaid patent for such background. The subject matter of this invention has been confined specifically to the novelty in the selector knob construction which is to be explained within the following paragraphs.

Referring particularly to the drawing, there is shown a portion of an electrical meter having a housing 10 and a cover 12. The cover 12 is to be fixedly mounted by fasteners (not shown) to the housing 10. It is to be understood that within the chamber defined between the housing 10 and the cover 12 there is to be located some form of an electrical device (not shown) which is to take electrical readings. These electrical readings are to be observed by the operator through an appropriate lens (not shown) mounted upon the cover 12. A meter face is to be observed through the lens and is to include appropriate scale indicia which is to be capable of being read by the operator. A movable needle is to be mounted adjacent the face and is movable thereacross by means of a conventional D'Arsonval movement which is well known in the field of electrical meters.

Upon the cover 12 is mounted a selector knob 14, with the knob 14 being rotatable to a plurality of different positions (not shown). It is to be understood that for each position of the knob 14 a particular separate scale is to be observed upon the face of the meter.

Formed within the cover 12 is a first opening 16. Extending within the first opening 16 is an actuator 18 for conventional switching mechanism 20. The switching mechanism 20 is to preselect the meter of this invention to take different types of readings, such, as for example, a reading on a six cylinder automobile or a reading on either a four cylinder or eight cylinder automobile. The switch 20 is mounted upon and electrically connected to appropriate circuitry upon a printed circuit board 22. The board 22 is fixedly mounted by threaded fasteners 24 to the underside of the cover 12.

The knob 14 has an interior recess 26 and is to connect with the shaft of a switch rotor 28. The switch rotor 28 includes a pair of diametrically spaced apart arms 30 and 32 extending transversely from the center shaft 34 of the switch rotor 28. The shaft 34 has formed thereon a flange 36 which is spaced from the arms 30 and 32. The flange 36 is of an odd configuration and is to cooperate with an appropriate mating opening 38 formed within a panel bushing 40. The shaft 34 is conducted through the opening 38 and can only be conducted therethrough when a particular position is established between the panel bushing 40 and the shaft 34 which has been established by the configuration of the flange 36 in the opening 38. However, once the panel bushing 40 is completely inserted upon the rotor switch 28 so that the base of the panel bushing 40 rests against the arms 30 and 32, 360° rotational movement is permitted of the panel bushing 40 with respect to the rotor switch 28.

The second opening 42 is formed within the cover 12. The shaft 34 of the rotor switch extends through the opening 42 and also a portion of the panel bushing 40 extends through the opening 42. The base of the bushing 40 is to come into abutting contact with the underside of the cover 12 and a push-on nut 44 is to secure the bushing 40 to the cover 12. It is to be noted that the opening 38 is slightly larger than the shaft 34. This permits a limited amount of canting movement of the shaft 34 with respect to the panel bushing 40. This is desirable, so it is not required that the panel bushing 40 and the rotor switch 28 be constructed with a high degree of tolerance, and if the parts, when assembled, are slightly misaligned with respect to one another, the misalignment can be readily absorbed by slight canting of the shaft 34. Although the shaft 34 might be canted a few thousandths of an inch, there is no hindrance in the operation of the device and the device operates with 100 percent effectiveness.

Located on the underside of the cover 12 are a plurality of protuberances 46. With the panel bushing 40 connected to the cover 12, the arms 30 and 32 are forced into tight contact with the protuberances 46. With the arms 30 and 32 resting between an adjacent pair of protuberances 46, a given position of the shaft 34 is obtained. By exterting a certain amount of manual movement upon the knob 14, the arms 30 and 32 can be moved from an adjacent pair of protuberances 46 to another adjacent pair of protuberances 46 and thereby locating the shaft 34 in another position.

The free end of the shaft 34 is to be located within a socket 48 formed within a plug 50. The shaft 34 is to form a sloppy fit within the socket 48 thereby not requiring any high degree of tolerance between the shaft 34 and the plug 50. The plug 50 is to cooperate in a loose fitting manner within an opening 52 formed within the printed circuit board 22. The inner end 54 of the plug 50 is formed non-circular and is to retain thereabout an electrical contact member 56. The electrical contact member 56 is basically S-shaped and includes a first end 58 and a second end 60. Centrally located within the member 56 is a non-circular opening 62. The shaft 34 is to close fittingly pass through the opening 62 and connect with a push-on nut 64. As a result, the member 56 is non-rotatably secured to the shaft 54.

In respect to the opening 62, the end 58 is diametrically located opposite end 60. Within the end 58 is located an opening 66. A similar opening 68 is formed within the end 60. Basically, each of the openings 66 and 68 are thin slots.

A resilient contact member 70 having a plurality of springy contact members 72 is to be close fittingly mounted within the opening 66 with the U-shaped member 74 of the member 70 being snugly retained within the opening 66. In a similar manner, an identical contact member 76 is employed which includes spring biased contacts 78 and a U-shaped section 80 which is to be snugly retained within the opening 68.

The spring contact members 72 and 78 are to physically contact the underside of the printed circuit board 22. The resultant force produced tends to maintain the member 56 parallel to the surface of the printed circuit board 22 and because of the inherent resiliency, will automatically accommodate any misalignment.

It is to be understood that as the knob 14 is rotated, the contact members 70 and 76 are rotated with the plug 50. The diametrically opposite arrangement of the contacts 72 and 78 is constantly maintained during this rotation.

It is to be noted by referring to the drawing that each of the contacts 72 and 78 include four separate contact sections. Each of these contact sections are designed to physically connect with appropriate electrical circuitry formed upon the printed circuit board 22.

It is also contemplated that the member 56 may include two separate contact members located on each of the arms 58 and 60. Additionally, each of the arms 58 and 60 may include a number greater than two separate electrical contacts.

It is to be understood that the apparatus of this invention could be employed within a two pole switching apparatus, a three pole switching apparatus or even a four pole switching apparatus.

What is claimed is:

1. In combination with an electrical meter apparatus, said electrical meter apparatus being mounted within a housing, said housing being connected with visual observation means for denoting various electrical readings, electronic circuitry mounted on a printed circuit board, said printed circuit board located within said housing, said electrical circuitry connected to operate said visual observation means, said electronic circuitry including a plurality of separate circuit paths, the improvement comprising:

selector means connected to said housing and being movable to select an individual said circuit path of said plurality of separate circuit paths, said selector means including a plug rotatably mounted within an oversized opening within said printed circuit board, said plug capable of a limited amount of canting movement relative to said printed circuit board, an electrical contact member attached to said plug the portion of said contact member to be in physical contact with said printed circuit board, said portion comprising at least a pair of electrical contacts each of which are spring biased towards said printed circuit board with the same degree of force, the resultant force of said spring biased contacts tending to maintain said plug axially aligned within said oversized opening, said electrical contacts being aligned 180° apart about said member; and said selector means including a manually operatable knob located exteriorly of said housing, said knob being connected with a switch rotor, said switch rotor extending through an opening in said housing, a portion of said switch rotor cooperating in a loose fitting manner with a socket formed within said plug, said switch rotor being rotatable with respect to said housing, the interconnection between said housing and said switch rotor permitting a limited amount of canting movement of said switch rotor relative to said housing.

2. The combination as defined in claim 1 including:

a panel bushing located upon said switch rotor, said panel bushing being fixedly connected to said housing, said switch rotor being rotatable with respect to said panel bushing, the interconnection between said panel bushing and said switch rotor permitting a limited amount of canting movement of said switch rotor relative to said panel bushing.

3. The combination as defined in claim 1 wherein:

each of said electrical contacts having an attaching end, said attaching end comprising a substantially U-shaped resilient member, and electrical contact member including a pair of spaced apart recesses, an attaching end of said electrical contact to be snugly positioned within a said recess.

* * * * *